(12) United States Patent
Wang et al.

(10) Patent No.: US 10,838,403 B2
(45) Date of Patent: Nov. 17, 2020

(54) SIMULATION METHOD FOR MILLING BY USE OF DYNAMIC POSITION ERROR

(71) Applicant: INDUSTRIAL TECHNOLOGY RESEARCH INSTITUTE, Hsin-Chu (TW)

(72) Inventors: Cheng-Wei Wang, Taipei (TW); Kuo-Hua Chou, Hsinchu County (TW); Chien-Chih Liao, Taichung (TW); Jen-Ji Wang, Taichung (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 125 days.

(21) Appl. No.: 16/229,276

(22) Filed: Dec. 21, 2018

(65) Prior Publication Data

US 2020/0166906 A1    May 28, 2020

(30) Foreign Application Priority Data

Nov. 28, 2018   (TW) ............................. 107142443 A

(51) Int. Cl.
  *G05B 19/4099*   (2006.01)
  *G06F 17/16*     (2006.01)
  *G05B 19/25*     (2006.01)

(52) U.S. Cl.
  CPC ....... *G05B 19/4099* (2013.01); *G05B 19/258* (2013.01); *G06F 17/16* (2013.01); *G05B 2219/35346* (2013.01)

(58) Field of Classification Search
  CPC ................................................ G05B 19/4099
  See application file for complete search history.

(56) References Cited

U.S. PATENT DOCUMENTS 5,710,709 A   1/1998 Oliver et al.
7,024,272 B2  4/2006 Thmoas et al.
(Continued)

FOREIGN PATENT DOCUMENTS

CN   103093036 A   5/2013
CN   102566500 B   9/2013
(Continued)

OTHER PUBLICATIONS

TIPO, "Notice of Allowance for TW Application No. 107142443", Taiwan, dated Aug. 8, 2019.
(Continued)

*Primary Examiner* — Nathan L Laughlin
(74) *Attorney, Agent, or Firm* — Locke Lord LLP; Tim Tingkang Xia, Esq.

(57) ABSTRACT

A simulation method for milling by use of a dynamic position error includes the steps of: (a) generating a milling surface from a numerical control code, the milling surface having a plurality of grid points, the numerical control code having a position command; (b) calculating a normal vector for each of the plurality of grid points on the milling surface; (c) feeding back a position feedback of each of the plurality of grid points by the controller of the machine tool, and deriving a corresponding three-axis dynamic position error of the milling surface according to the position command and the position feedback; (d) calculating a component of the normal vector for the three-axis dynamic position error so as to obtain a normal-vector error value of the corresponding grid point; and, (e) displaying undercutting information of the normal-vector error value of the corresponding grid point on the milling surface.

9 Claims, 14 Drawing Sheets

(56) References Cited

U.S. PATENT DOCUMENTS

| | | |
|---|---|---|
| 7,177,734 B2 | 2/2007 | Fossen et al. |
| 8,010,328 B2 | 8/2011 | Frisken et al. |
| 9,524,583 B2 | 12/2016 | Montana et al. |
| 2003/0083773 A1 | 5/2003 | Schwanecke et al. |
| 2003/0171840 A1* | 9/2003 | Haupt ............... G05B 19/41 700/175 |
| 2004/0070583 A1* | 4/2004 | Tsai ............... G06T 17/10 345/419 |
| 2004/0233194 A1* | 11/2004 | Manson ............... G06T 17/00 345/419 |
| 2005/0168460 A1* | 8/2005 | Razdan ............... G06F 16/2428 345/419 |
| 2011/0190922 A1* | 8/2011 | Walker ............... B24B 13/06 700/118 |
| 2011/0245954 A1* | 10/2011 | Sullivan ............... G06T 17/10 700/104 |
| 2012/0221300 A1* | 8/2012 | Tukora ............... G05B 19/4069 703/1 |
| 2012/0265331 A1* | 10/2012 | Chu ............... G06F 30/00 700/103 |
| 2013/0129170 A1* | 5/2013 | Zheng ............... G06T 7/12 382/131 |
| 2018/0144545 A1* | 5/2018 | Legrand ............... G06T 17/005 |
| 2019/0143523 A1* | 5/2019 | Harel ............... G01N 21/9515 700/259 |

FOREIGN PATENT DOCUMENTS

| | | |
|---|---|---|
| CN | 104898564 A | 9/2015 |
| CN | 104615083 B | 5/2017 |
| TW | 200402524 A | 2/2004 |
| TW | I362575 B | 4/2012 |
| TW | I414376 B | 11/2013 |

OTHER PUBLICATIONS

Shih, Chih-Hsuan, "Introduction of Robot CDA/CAM Toolpath planning and Application of Grinding and Polishing" Journal of Mechanism Industrial Magazine, vol. 400, Jul. 2016.

Matsubara, Atsushi, "Servo Performance Enhancement of High Speed Feed Drives by Damping Control", Proceedings of the 2000 Japan USA Flexible Automation Conference, Jul. 23-26, 2000, Ann Arbor, Michigan.

* cited by examiner

```
G90 G0 X0 Y0
G43 Z10.0 H01
X39.48967 Y-40.73029
G1 Z-6.81824F2000
N1 X39.48967 Y-40.73029 Z-6.81824F2400
X39.36332-6.81824
X39.3001Z-6.82143
X39.23694Z-6.82662
X39.17376Z-6.83384
X39.11057Z-6.84311
X39.04739Z-6.85445
X38.9842Z-6.86791
X38.92102Z-6.88352
X38.85784Z-6.90134
X38.79465Z-6.92144
X38.73147Z-6.94388
X38.66829Z-6.96875
X38.6051Z-6.99616
X38.54192Z-7.0262
X38.47874Z-7.05904
X38.41555Z-7.09481
X38.35237Z-7.13371
X38.28918Z-7.17596
X38.226Z-7.22183
X38.16282Z-7.27164
X38.09964Z-7.32579
```

X coordinate of grid of milling surface — Grid number

| | 1 | 2 | 3 | 4 | 5 | 6 | 7 | 8 | 9 | 10 |
|---|---|---|---|---|---|---|---|---|---|---|
| 1 | NaN | NaN | -39.2903 | -39.1903 | -39.0903 | -38.9903 | -38.8903 | -38.7903 | -38.6903 | -38.5903 |
| 2 | NaN | -39.3903 | -39.2903 | -39.1903 | -39.0903 | -38.9903 | -38.8903 | -38.7903 | -38.6903 | -38.5903 |
| 3 | -39.4903 | -39.3903 | -39.2903 | -39.1903 | -39.0903 | -38.9903 | -38.8903 | -38.7903 | -38.6903 | -38.5903 |
| 4 | -39.4903 | -39.3903 | -39.2903 | -39.1903 | -39.0903 | -38.9903 | -38.8903 | -38.7903 | -38.6903 | -38.5903 |
| 5 | -39.4903 | -39.3903 | -39.2903 | -39.1903 | -39.0903 | -38.9903 | -38.8903 | -38.7903 | -38.6903 | -38.5903 |
| 6 | -39.4903 | -39.3903 | -39.2903 | -39.1903 | -39.0903 | -38.9903 | -38.8903 | -38.7903 | -38.6903 | -38.5903 |
| 7 | -39.4903 | -39.3903 | -39.2903 | -39.1903 | -39.0903 | -38.9903 | -38.8903 | -38.7903 | -38.6903 | -38.5903 |
| 8 | -39.4903 | -39.3903 | -39.2903 | -39.1903 | -39.0903 | -38.9903 | -38.8903 | -38.7903 | -38.6903 | -38.5903 |
| 9 | NaN | -39.3903 | -39.2903 | -39.1903 | -39.0903 | -38.9903 | -38.8903 | -38.7903 | -38.6903 | -38.5903 |
| 10 | NaN | NaN | -39.2903 | -39.1903 | -39.0903 | -38.9903 | -38.8903 | -38.7903 | -38.6903 | -38.5903 |

Grid number

FIG. 4A

Y coordinate of grid of milling surface — Grid number

| | 1 | 2 | 3 | 4 | 5 | 6 | 7 | 8 | 9 | 10 |
|---|---|---|---|---|---|---|---|---|---|---|
| 1 | NaN | NaN | -40.7298 | -40.7298 | -40.7298 | -40.7298 | -40.7298 | -40.7298 | -40.7298 | -40.7298 |
| 2 | NaN | -40.6298 | -40.6298 | -40.6298 | -40.6298 | -40.6298 | -40.6298 | -40.6298 | -40.6298 | -40.6298 |
| 3 | -40.5298 | -40.5298 | -40.5298 | -40.5298 | -40.5298 | -40.5298 | -40.5298 | -40.5298 | -40.5298 | -40.5298 |
| 4 | -40.4298 | -40.4298 | -40.4298 | -40.4298 | -40.4298 | -40.4298 | -40.4298 | -40.4298 | -40.4298 | -40.4298 |
| 5 | -40.3298 | -40.3298 | -40.3298 | -40.3298 | -40.3298 | -40.3298 | -40.3298 | -40.3298 | -40.3298 | -40.3298 |
| 6 | -40.2298 | -40.2298 | -40.2298 | -40.2298 | -40.2298 | -40.2298 | -40.2298 | -40.2298 | -40.2298 | -40.2298 |
| 7 | -40.1298 | -40.1298 | -40.1298 | -40.1298 | -40.1298 | -40.1298 | -40.1298 | -40.1298 | -40.1298 | -40.1298 |
| 8 | -40.0298 | -40.0298 | -40.0298 | -40.0298 | -40.0298 | -40.0298 | -40.0298 | -40.0298 | -40.0298 | -40.0298 |
| 9 | NaN | -39.9298 | -39.9298 | -39.9298 | -39.9298 | -39.9298 | -39.9298 | -39.9298 | -39.9298 | -39.9298 |
| 10 | NaN | NaN | -39.8298 | -39.8298 | -39.8298 | -39.8298 | -39.8298 | -39.8298 | -39.8298 | -39.8298 |

Grid number

FIG. 4B

| | 1 | 2 | 3 | 4 | 5 | 6 | 7 | 8 | 9 | 10 |
|---|---|---|---|---|---|---|---|---|---|---|
| 1 | NaN | NaN | -3.5682 | -3.5682 | -3.5682 | -3.5682 | -3.5682 | -3.5682 | -3.5682 | -3.5682 |
| 2 | NaN | -3.5682 | -3.5682 | -3.5682 | -3.5682 | -3.5682 | -3.5682 | -3.5682 | -3.5682 | -3.5682 |
| 3 | -3.5682 | -3.5682 | -3.5682 | -3.5682 | -3.5682 | -3.5682 | -3.5682 | -3.5682 | -3.5682 | -3.5682 |
| 4 | -3.5682 | -3.5682 | -3.5682 | -3.5682 | -3.5682 | -3.5682 | -3.5682 | -3.5682 | -3.5682 | -3.5682 |
| 5 | -3.5682 | -3.5682 | -3.5682 | -3.5682 | -3.5682 | -3.5682 | -3.5682 | -3.5682 | -3.5682 | -3.5682 |
| 6 | -3.5682 | -3.5682 | -3.5682 | -3.5682 | -3.5682 | -3.5682 | -3.5682 | -3.5682 | -3.5682 | -3.5682 |
| 7 | -3.5682 | -3.5682 | -3.5682 | -3.5682 | -3.5682 | -3.5682 | -3.5682 | -3.5682 | -3.5682 | -3.5682 |
| 8 | -3.5682 | -3.5682 | -3.5682 | -3.5682 | -3.5682 | -3.5682 | -3.5682 | -3.5682 | -3.5682 | -3.5682 |
| 9 | NaN | -3.5682 | -3.5682 | -3.5682 | -3.5682 | -3.5682 | -3.5682 | -3.5682 | -3.5682 | -3.5682 |
| 10 | NaN | NaN | -3.5682 | -3.5682 | -3.5682 | -3.5682 | -3.5682 | -3.5682 | -3.5682 | -3.5682 |

FIG. 4C

X-directional component of normal vector / Grid number (columns) / Grid number (rows)

| | 1 | 2 | 3 | 4 | 5 | 6 | 7 | 8 | 9 | 10 |
|---|---|---|---|---|---|---|---|---|---|---|
| 1 | NaN | NaN | -2.2204e-15 | 2.2204e-15 | 2.2204e-15 | 0 | 0 | -2.2204e-15 | -2.2204e-15 | 2.2204e-15 |
| 2 | NaN | 0 | -2.2204e-15 | 2.2204e-15 | 2.2204e-15 | -4.4409e-15 | 2.2204e-15 | 2.2204e-15 | 0 | 0 |
| 3 | 8.8818e-15 | 2.2204e-15 | 2.2204e-15 | 0 | -4.4409e-15 | 0 | 0 | 0 | 2.2204e-15 | 0 |
| 4 | 0 | 0 | 0 | 0 | -2.2204e-15 | 0 | 2.2204e-15 | 0 | -2.2204e-15 | 0 |
| 5 | 2.2204e-15 | -2.2204e-15 | -2.2204e-15 | 2.2204e-15 | 0 | 0 | 4.4409e-15 | -2.2204e-15 | -4.4409e-15 | 2.2204e-15 |
| 6 | -1.1102e-14 | 0 | 0 | 2.2204e-15 | 0 | -2.2204e-15 | 2.2204e-15 | -2.2204e-15 | -2.2204e-15 | 0 |
| 7 | -1.1102e-14 | 0 | 0 | 0 | 2.2204e-15 | 2.2204e-15 | -2.2204e-15 | -2.2204e-15 | 0 | 0 |
| 8 | 1.1102e-14 | 0 | 0 | 2.2204e-15 | -2.2204e-15 | -4.4409e-15 | 0 | 2.2204e-15 | 0 | 0 |
| 9 | NaN | 2.2204e-15 | -2.2204e-15 | 0 | 0 | -2.2204e-15 | 0 | 0 | -2.2204e-15 | -2.2204e-15 |
| 10 | NaN | NaN | -2.2204e-15 | -2.2204e-15 | 2.2204e-15 | 2.2204e-15 | 0 | 2.2204e-15 | -2.2204e-15 | -2.2204e-15 |

FIG. 7A

Y-directional component of normal vector / Grid number (columns) / Grid number (rows)

| | 1 | 2 | 3 | 4 | 5 | 6 | 7 | 8 | 9 | 10 |
|---|---|---|---|---|---|---|---|---|---|---|
| 1 | NaN | NaN | 0 | -1.3323e-14 | 2.2204e-15 | -6.6613e-15 | -1.9984e-14 | 4.4409e-15 | 0 | 1.1102e-14 |
| 2 | NaN | -2.2204e-15 | 0 | 2.2204e-15 | -2.2204e-15 | -4.4409e-15 | -2.2204e-15 | -4.4409e-15 | 0 | 0 |
| 3 | 0 | 0 | 0 | 2.2204e-15 | -2.2204e-15 | -2.2204e-15 | 2.2204e-15 | -2.2204e-15 | 0 | -4.4409e-15 |
| 4 | 2.2204e-15 | 0 | -2.2204e-15 | -4.4409e-15 | 0 | 0 | 0 | 4.4409e-15 | -2.2204e-15 | -2.2204e-15 |
| 5 | 0 | -2.2204e-15 | 0 | -2.2204e-15 | 2.2204e-15 | 0 | 0 | 0 | -2.2204e-15 | 0 |
| 6 | 0 | -2.2204e-15 | 2.2204e-15 | 0 | 0 | 2.2204e-15 | 2.2204e-15 | -4.4409e-15 | 2.2204e-15 | 0 |
| 7 | 0 | 4.4409e-15 | 0 | 4.4409e-15 | 0 | 2.2204e-15 | -2.2204e-15 | 0 | 2.2204e-15 | 2.2204e-15 |
| 8 | 0 | 4.4409e-15 | 2.2204e-15 | 2.2204e-15 | 2.2204e-15 | 0 | -2.2204e-15 | 2.2204e-15 | 0 | 0 |
| 9 | NaN | -2.2204e-15 | 0 | -4.4409e-15 | -4.4409e-15 | 0 | 2.2204e-15 | 0 | 2.2204e-15 | -2.2204e-15 |
| 10 | NaN | NaN | -1.1102e-14 | -6.6613e-15 | -1.7764e-14 | 0 | -2.2204e-15 | 0 | 8.8818e-15 | 2.2204e-15 |

FIG. 7B

|   | 1 | 2 | 3 | 4 | 5 | 6 | 7 | 8 | 9 | 10 |
|---|---|---|---|---|---|---|---|---|---|---|
| 1 | NaN | NaN | 1 | 1 | 1 | 1 | 1 | 1 | 1 | 1 |
| 2 | NaN | 1 | 1 | 1 | 1 | 1 | 1 | 1 | 1 | 1 |
| 3 | 1 | 1 | 1 | 1 | 1 | 1 | 1 | 1 | 1 | 1 |
| 4 | 1 | 1 | 1 | 1 | 1 | 1 | 1 | 1 | 1 | 1 |
| 5 | 1 | 1 | 1 | 1 | 1 | 1 | 1 | 1 | 1 | 1 |
| 6 | 1 | 1 | 1 | 1 | 1 | 1 | 1 | 1 | 1 | 1 |
| 7 | 1 | 1 | 1 | 1 | 1 | 1 | 1 | 1 | 1 | 1 |
| 8 | 1 | 1 | 1 | 1 | 1 | 1 | 1 | 1 | 1 | 1 |
| 9 | NaN | 1 | 1 | 1 | 1 | 1 | 1 | 1 | 1 | 1 |
| 10 | NaN | NaN | 1 | 1 | 1 | 1 | 1 | 1 | 1 | 1 |

Z-directional component of normal vector

Grid number (columns and rows)

FIG. 7C

| No | Time | X axis | Y axis | Z axis | ERR X | ERR Y | ERR Z |
|---|---|---|---|---|---|---|---|
| | msec | mm | mm | mm | um | um | um |
| | | PB | | | EB | | |
| 0 | 0 | 51.99967 | −40.7298 | −6.81424 | 0 | 0 | −5 |
| 1 | 1 | 51.99967 | −40.7298 | −6.81424 | 0 | 0 | −5 |
| 2 | 2 | 51.99967 | −40.7298 | −6.81424 | 0 | 0 | −5 |
| 3 | 3 | 51.99967 | −40.7298 | −6.81424 | 0 | 0 | −5 |
| 4 | 4 | 51.99967 | −40.7298 | −6.81424 | 0 | 0 | −5 |
| 5 | 5 | 51.99967 | −40.7298 | −6.81424 | 0 | 0 | −5 |
| 6 | 6 | 51.99967 | −40.7298 | −6.81424 | 0 | 0 | −5 |
| 7 | 7 | 51.99967 | −40.7298 | −6.81624 | 0 | 0 | −3 |
| 8 | 8 | 51.99967 | −40.7298 | −6.81524 | 0 | 0 | −4 |
| 9 | 9 | 51.99967 | −40.7298 | −6.81524 | 0 | 0 | −4 |
| 10 | 10 | 51.99967 | −40.7298 | −6.81524 | 0 | 0 | −4 |
| 11 | 11 | 51.99967 | −40.7298 | −6.81524 | 0 | 0 | −4 |
| 12 | 12 | 51.99967 | −40.7298 | −6.81524 | 0 | 0 | −4 |
| 13 | 13 | 51.99967 | −40.7298 | −6.81524 | 0 | 0 | −4 |
| 14 | 14 | 51.99967 | −40.7298 | −6.81524 | 0 | 0 | −4 |
| 15 | 15 | 51.99967 | −40.7298 | −6.81524 | 0 | 0 | −4 |
| 16 | 16 | 51.99967 | −40.7298 | −6.81524 | 0 | 0 | −4 |
| 17 | 17 | 51.99967 | −40.7298 | −6.81524 | 0 | 0 | −4 |
| 18 | 18 | 51.99967 | −40.7298 | −6.81524 | 0 | 0 | −4 |
| 19 | 19 | 51.99967 | −40.7298 | −6.81524 | 0 | 0 | −4 |
| 20 | 20 | 51.99967 | −40.7298 | −6.81724 | 0 | 0 | −2 |
| 21 | 21 | 51.99967 | −40.7298 | −6.81624 | 0 | 0 | −3 |
| 22 | 22 | 51.99967 | −40.7298 | −6.81624 | 0 | 0 | −3 |
| 23 | 23 | 51.99967 | −40.7298 | −6.81624 | 0 | 0 | −3 |
| 24 | 24 | 51.99967 | −40.7298 | −6.81624 | 0 | 0 | −3 |
| 25 | 25 | 51.99967 | −40.7298 | −6.81624 | 0 | 0 | −3 |
| 26 | 26 | 51.99967 | −40.7298 | −6.81624 | 0 | 0 | −3 |
| 27 | 27 | 51.99967 | −40.7298 | −6.81624 | −1 | 0 | −3 |
| 28 | 28 | 51.99967 | −40.7298 | −6.81624 | −1 | 0 | −3 |
| 29 | 29 | 51.99967 | −40.7298 | −6.81624 | −1 | 0 | −3 |
| 30 | 30 | 51.99967 | −40.7298 | −6.81624 | −1 | 0 | −3 |
| 31 | 31 | 51.99967 | −40.7298 | −6.81624 | −1 | 0 | −3 |
| 32 | 32 | 51.99967 | −40.7298 | −6.81624 | −2 | 0 | −3 |
| 33 | 33 | 51.99967 | −40.7298 | −6.81624 | −2 | 0 | −1 |

FIG. 8

Normal vector error

|  | 1 | 2 | 3 | 4 | 5 | 6 | 7 | 8 | 9 | 10 |
|---|---|---|---|---|---|---|---|---|---|---|
| 1 | 0 | 0 | 6.6613e-15 | -6.6613e-15 | -4.4409e-15 | 0 | 0 | 2.2204e-15 | 2.2204e-15 | 2.2204e-15 |
| 2 | 0 | 0 | 4.4409e-15 | -4.4409e-15 | -4.4409e-15 | 4.4409e-15 | -2.2204e-15 | -2.2204e-15 | 0 | 0 |
| 3 | -4.4409e-14 | -8.8818e-15 | -8.8818e-15 | 0 | 8.8818e-15 | 0 | 0 | 0 | 0 | -4.4409e-15 |
| 4 | -2.2204e-15 | 0 | 0 | 0 | 4.4409e-15 | 0 | -2.2204e-15 | 0 | 2.2204e-15 | 0 |
| 5 | -8.8818e-15 | 8.8818e-15 | 8.8818e-15 | -6.6613e-15 | 2.2204e-15 | 0 | -8.8818e-15 | 2.2204e-15 | -6.6613e-15 | 2.2204e-15 |
| 6 | 1.1102e-14 | 0 | 0 | -6.6613e-15 | 0 | 4.4409e-15 | -2.2204e-15 | 2.2204e-15 | -2.2204e-15 | 0 |
| 7 | 4.4409e-14 | 4.4409e-15 | 0 | 0 | -4.4409e-15 | -6.6613e-15 | 4.4409e-15 | -2.2204e-15 | 2.2204e-15 | 2.2204e-15 |
| 8 | -1.1102e-14 | 0 | 0 | -4.4409e-15 | 4.4409e-15 | 8.8818e-15 | 0 | -2.2204e-15 | 0 | 0 |
| 9 | 0 | -8.8818e-15 | 8.8818e-15 | 0 | -4.4409e-15 | 2.2204e-15 | 0 | 0 | -2.2204e-15 | -4.4409e-15 |
| 10 | 0 | 0 | 4.4409e-15 | 4.4409e-15 | -4.4409e-15 | -4.4409e-15 | 0 | -2.2204e-15 | 2.2204e-15 | -2.2204e-15 |

SIMULATION METHOD FOR MILLING BY USE OF DYNAMIC POSITION ERROR

CROSS REFERENCE TO RELATED APPLICATION

This application claims the benefits of Taiwan application Serial No. 107142443, filed on Nov. 28, 2018, the disclosures of which are incorporated by references herein in its entirety.

TECHNICAL FIELD

The present disclosure relates in general to a simulation method for milling, and more particularly to a simulation method for milling by use of a dynamic position error.

BACKGROUND

In the art of conventional machining simulations, if an effect of errors upon the model surface is to be estimated, CAD/CAM software such as NX, CATIA, VERICUT and the like, is usually applied. Generally, while in simulating the machining by the CAD/CAM software, numerical control codes are inputted into the corresponding machine tool to define a machining path for a cutting tool to follow and a material of workpiece to be removed by the cutting tool is defined by the intersection of the workpiece and the cutting tool. Thereupon, the simulation of machining can thus be performed.

As described above, the CAD/CAM software generally applies the numerical control code to simulate largely the machining. In other words, the conventional calculation of the material to be removed during the simulation is mainly to follow the machining path defined by the numerical control code inputted to the machine tool. In this calculation, it is concerned only if the cutting tool is interfered in the machine tool during the simulation, or the height of material left in the simulated milling surface. Apparently, dynamic factors to cause simulation errors such as the control, the interpolation technique or the structuring of the machine tool are not taken into consideration. Thus, in the conventional simulation upon machining by using CAD/CAM software, these dynamic errors that cause defects on the milling surface are not considered, and the calculation on the material to be removed usually costs plenty of time.

SUMMARY

An object of the present disclosure is to provide a simulation method for milling by use of a dynamic position error, which utilizes a projected normal vector on a milling surface from a three-axis dynamic position error to simulate undercutting. Except that the defects on the milling surface caused by dynamic errors can be really presented, simulation time can be also reduced.

Another object of this present disclosure is to provide a simulation method for milling by use of a dynamic position error that is applicable for connecting a controller of a machine tool. This simulation method includes the steps of: (a) generating a milling surface from a numerical control code, the milling surface having a plurality of grid points, the numerical control code having a position command; (b) calculating a normal vector for each of the plurality of grid points on the milling surface; (c) feeding back a position feedback of each of the plurality of grid points by the controller of the machine tool, and deriving a corresponding three-axis dynamic position error of the milling surface according to the position command and the position feedback; (d) calculating a component of the normal vector for the three-axis dynamic position error so as to obtain a normal-vector error value of the corresponding grid point; and, (e) displaying undercutting information of the normal-vector error value of the corresponding grid point on the milling surface.

A further object of the present disclosure is to provide a simulation method for milling by use of a dynamic position error that is applicable to connect a machine tool further connecting an electromechanical analysis module. This simulation method includes the steps of: (a) generating a milling surface from a numerical control code, the milling surface having a plurality of grid points, the numerical control code having a position command; (b) calculating a normal vector for each of the plurality of grid points on the milling surface; (c) feeding back a position feedback of each of the plurality of grid points by the electromechanical analysis module, and deriving a corresponding three-axis dynamic position error of the milling surface according to the position command and the position feedback; (d) calculating a component of the normal vector for the three-axis dynamic position error so as to obtain a normal-vector error value of the corresponding grid point; and, (e) displaying undercutting information of the normal-vector error value of the corresponding grid point on the milling surface.

As stated, by providing the simulation method for milling by use of a dynamic position error in this disclosure, since the defects on the milling surface of the workpiece and the error values of the normal vector perpendicular to the milling surface are highly related. Empirically, the larger the error value is, the more serious the undercut at the milling surface would be. In this embodiment, the error management by projecting the three-axis dynamic position error to the normal vector on the milling surface can be used to simulate the undercutting. Such a method can provide precision estimates at errors, machining outcome and positions, thus the error caused by the structuring of the machine tool can be easily noticed, the error values on the milling surface can be clearly observed, possible cutting defects along the machining path can be alerted prior to a real cutting, and the cutting prints can be easily observed along the machining path.

Further, the simulation method for milling by use of a dynamic position error provided by this disclosure can reduce the complicated computation upon the material removal by crossing spatially the cutting tool and the workpiece. Also, by applying dot product to produce the three-axis dynamic position errors with the corresponding normal vector on the milling surface, the normal-vector error values can be obtained with an enhanced simulation speed.

In addition, the method provided by this disclosure can locate the maximum error values in the same machining method, and thus further improvement upon the machining method can be easily carried out.

In addition, this disclosure can further evaluate different machining error values among various machining methods to determine a preferable machining path, or to judge the effects from different machining variables, such that the object of determining a better machining method for specific products can be achieved.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein:

FIG. 4A demonstrates schematically an embodiment of X coordinates of the grid of a milling surface in accordance with this disclosure;

FIG. 4B demonstrates schematically an embodiment of Y coordinates of the grid of a milling surface in accordance with this disclosure;

FIG. 4C demonstrates schematically an embodiment of Z coordinates of the grid of a milling surface in accordance with this disclosure;

FIG. 7A demonstrates schematically an embodiment of X-directional components of the normal vectors in accordance with this disclosure;

FIG. 7B demonstrates schematically an embodiment of Y-directional components of the normal vectors in accordance with this disclosure;

FIG. 7C demonstrates schematically an embodiment of Z-directional components of the normal vectors in accordance with this disclosure;

FIG. 8 shows schematically an embodiment of the position feedbacks and the corresponding three-axis dynamic position errors in accordance with this disclosure;

DETAILED DESCRIPTION

Figure 1:
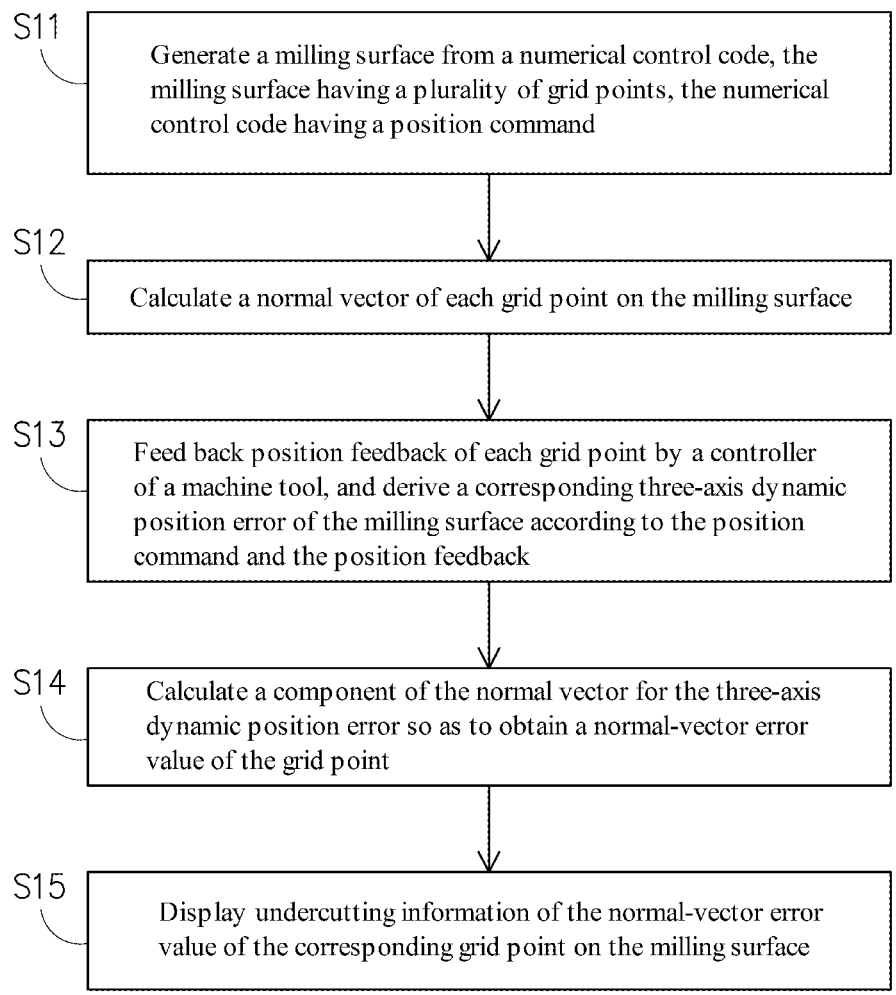
FIG. 1 is a flowchart of an embodiment of the simulation method for milling by use of a dynamic position error in accordance with this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to FIG. 1, a flowchart of an embodiment of the simulation method for milling by use of a dynamic position error in accordance with this disclosure is shown. In this embodiment, the simulation method for milling by use of a dynamic position error S10 can be fulfilled via hardware (such as processors, computers or mainframes), software (such as program codes performed by processors) or a relevant combination of software and hardware. In other words, this disclosure can be a software program that can utilize a processor or a computer to connect a controller of a machine tool to perform program codes in the processor (i.e., the simulation method for milling by use of a dynamic position error of this disclosure), so that a corresponding machining simulation can be performed upon the machine tool. In this embodiment, the simulation method for milling by use of a dynamic position error S10 includes Step S11 top Step S15. Firstly, Step S11 is performed. A numerical control code is utilized to generate a milling surface. In other words, 3D coordinate data of the numerical control code is used to plot a model resembling to a real workpiece. It shall be explained that the numerical control code (NC code) herein is to control machining steps of the machine tool. Namely, a cutting tool of the machine tool follows a predetermined machining path defined by the numerical control code to perform machining upon a workpiece according to a specific work order.

Figures 2A, 2B:
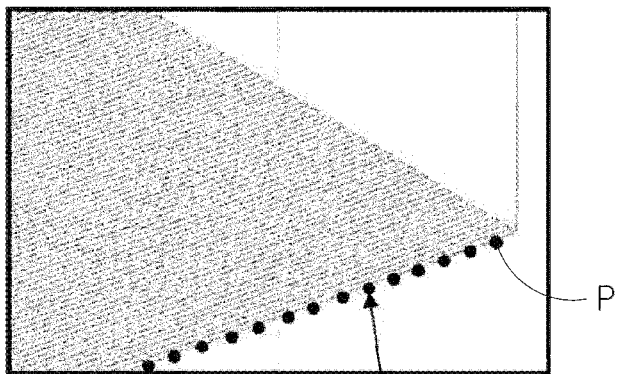
FIG. 2A is a schematic view of an embodiment of the numerical control code in accordance with this disclosure.
FIG. 2B shows schematically data of a node point within the numerical control code of FIG. 2A.

Refer now to FIG. 2A and FIG. 2B; where FIG. 2A is a schematic view of an embodiment of the numerical control code in accordance with this disclosure, and FIG. 2B shows schematically data of a node point within the numerical control code of FIG. 2A. As shown, the numerical control code is consisted of a plurality single node points P. Each of the single node points P in the numerical control code includes a program line number, a machining command and a position command. It shall be explained that the term "position command" herein stands for 3D coordinate data for three axes of the machine tool on the machining path; i.e. X-axis coordinate, Y-axis coordinate and Z-axis coordinate. For example, as shown in the highlight square of FIG. 2B, X39.48967 tells that the X-axis coordinate is 39.48967, Y−40.73029 tells that the Y-axis coordinate is −40.73029, and Z−6.81824 tells that the Z-axis coordinate is −6.81824. In addition, the aforesaid coordinates for the single node point are raised for a explanation purpose only, not for limiting the scope of applications of this disclosure.

Figure 3A:
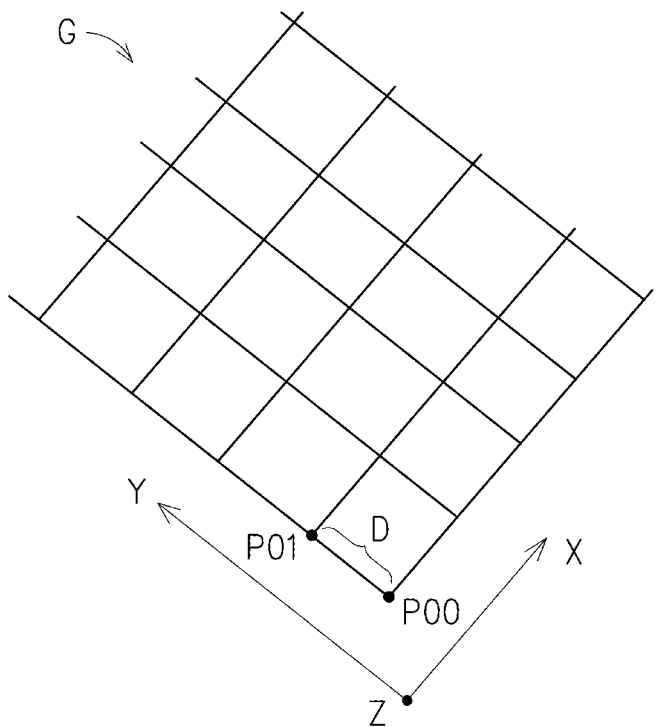
FIG. 3A is a schematic view of an embodiment of the 2D grid in accordance with this disclosure.
Figure 3B:
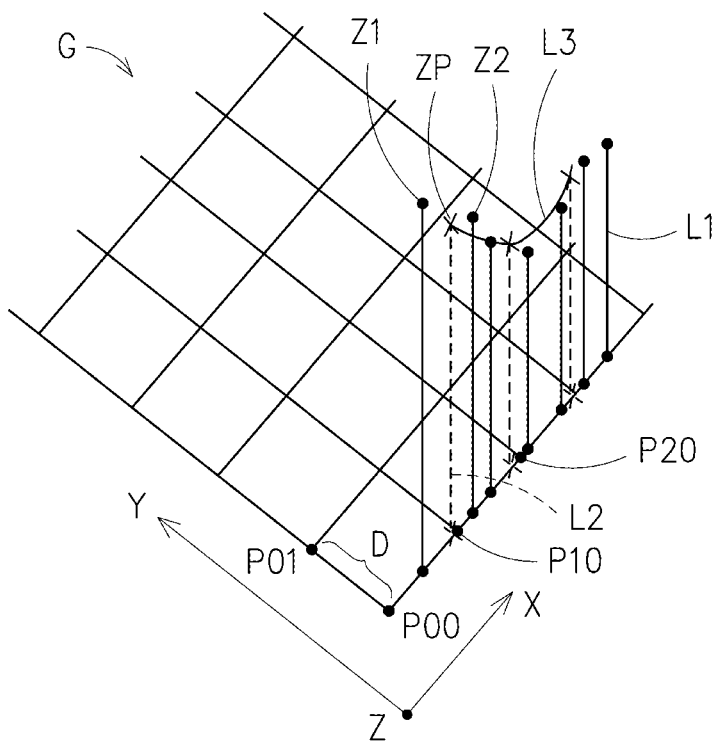
FIG. 3B shows schematically the 2D grid of FIG. 3A in an interpolation process.

For the numerical control code to generate a milling surface in Step S11, following steps shall be executed. Firstly, the X-axis coordinates, the Y-axis coordinates and the Z-axis coordinates of the position commands in the numerical control code shall be read. Then, refer now to FIG. 3A and FIG. 3B; where FIG. 3A is a schematic view of an embodiment of the 2D grid in accordance with this disclosure, and FIG. 3B shows schematically the 2D grid of FIG. 3A in an interpolation process. On the 2D plane expanded by the X axis and the Y axis, based on the range of the X coordinates and the range of the Y coordinates in the position commands of the numerical control code, a 2D grid G can be organized. In a relationship between the 2D grid G and the numerical control code, X coordinates of all the single node points in the numerical control code fall within the aforesaid range of the X coordinates, and Y coordinates of all the single node points in the numerical control code fall within the aforesaid range of the Y coordinates. For example, as shown in FIG. 3A and FIG. 3B, for the coordinate points Z1 and Z2 in the numerical control code, the corresponding X coordinates and Y coordinates are all fallen within the aforesaid range of the X coordinates and that of the Y coordinates for the 2D grid G of FIG. 3A, in which the grid point P00 tells that the corresponding grid number is (0, 0), and the grid point P01 tells that the corresponding grid number is (0, 1). In other words, after the numerical control code is obtained, then distributions of all the single node points can be realized. Further, the range of the X coordinates and that of the Y coordinates for the 2D grid G can be also understood. In addition, a graph unit D can be equal to a single node length of the numerical control code. In other words, a length between the grid points P00 and P01 is equal to the single node length between two neighboring single node points P.

Then, referring to the X coordinates and the Y coordinates of the position commands of the numerical control code, an interpolation process can be applied to add in the corresponding Z coordinates in the respective position commands of the 2D grid G, such that a 3D milling surface can be formed. Namely, the milling surface is established in accordance with a plurality of grid points. In establishing the 3D grid for the milling surface, interpolation calculations might be needed. For example, as shown in 3B, coordinate points Z1, Z2 on the 3D grid (the milling surface) have respective X-axis coordinates, falling to two opposite sides of 2D grid point P10. Then, the Z-axis coordinate ZP for the grid point P10 can be obtained by an interpolation algorithm by evaluating the X-axis coordinates of Z1, ZP, Z2 and the Z-axis coordinates of Z1, Z2. In particular, in this example, since only to grid points Z1, Z2 are used to interpolate the grid point ZP, thus only a linear interpolation can be applied. If more data can be involved to perform the interpolation, then a second or higher order fitting curve can be also applied to carry out the interpolation of this disclosure. Since the interpolation algorithm is well known in the art, thus details thereabout are omitted herein.

Figure 5:
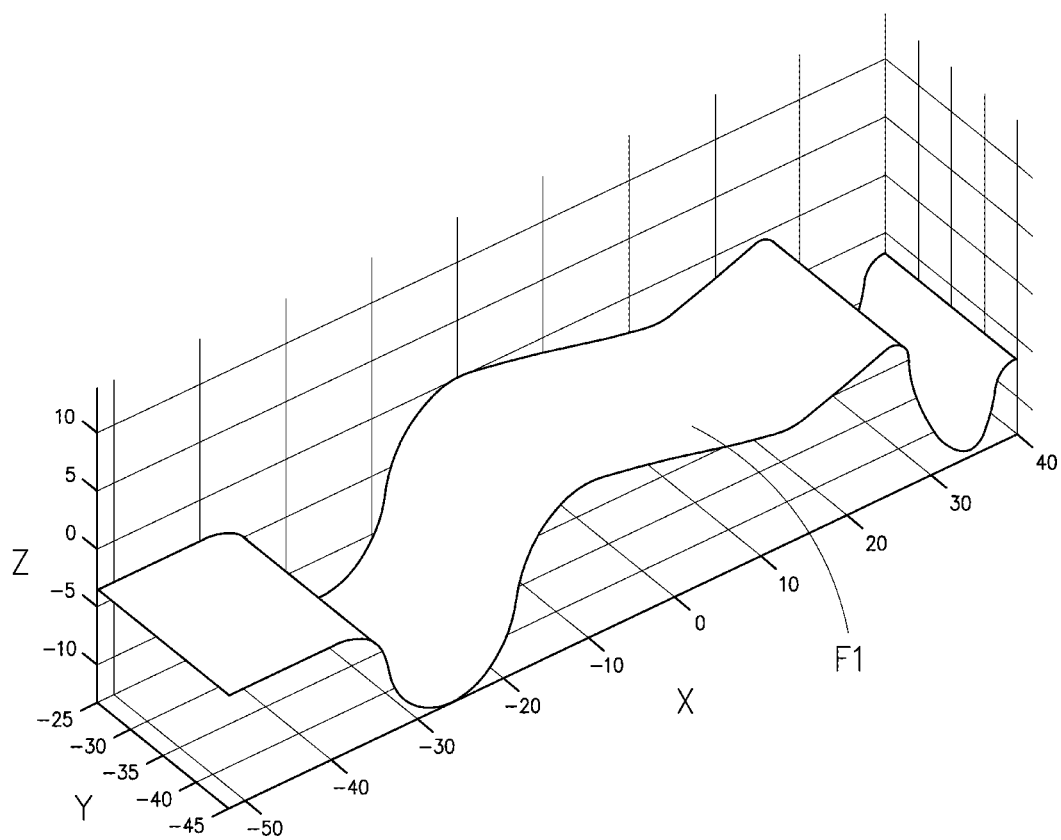
FIG. 5 shows schematically an embodiment of the milling surface in accordance with this disclosure.

Refer now to FIG. 4A to FIG. 4C; where FIG. 4A demonstrates schematically an embodiment of X coordinates of the grid of a milling surface in accordance with this disclosure, FIG. 4B demonstrates schematically an embodiment of Y coordinates of the grid of a milling surface in accordance with this disclosure, and FIG. 4C demonstrates schematically an embodiment of Z coordinates of the grid of a milling surface in accordance with this disclosure. By having Grid number (5, 5) as an example (highlighted by a square in the figure), the X-axis coordinate is −39.0903, the Y-axis coordinate is −40.3298, and the Z-axis coordinate is −3.5682 after the interpolation process. Thereupon, a 3D grid for the milling surface can be obtained. Referring back to FIG. 3B, after necessary interpolation processes, all the Z's can be connected to form a curve L3. Similarly, by expanding along the Y axis, more curves parallel to L3 spatially can be obtained according to the formulation described above. Thus, by connecting all the curves, a curved surface can be obtained, and this surface is the milling surface F1 (FIG. 5). Referring now to FIG. 5, an embodiment of the milling surface in accordance with this disclosure is schematically shown. Upon the aforesaid arrangement, by utilizing the numerical control code, the milling surface F1 for a model can be obtained to fit a real workpiece, and this milling surface F1 can be used much conveniently for calculating the normal vectors or displaying the stimulation results.

Figure 6A:
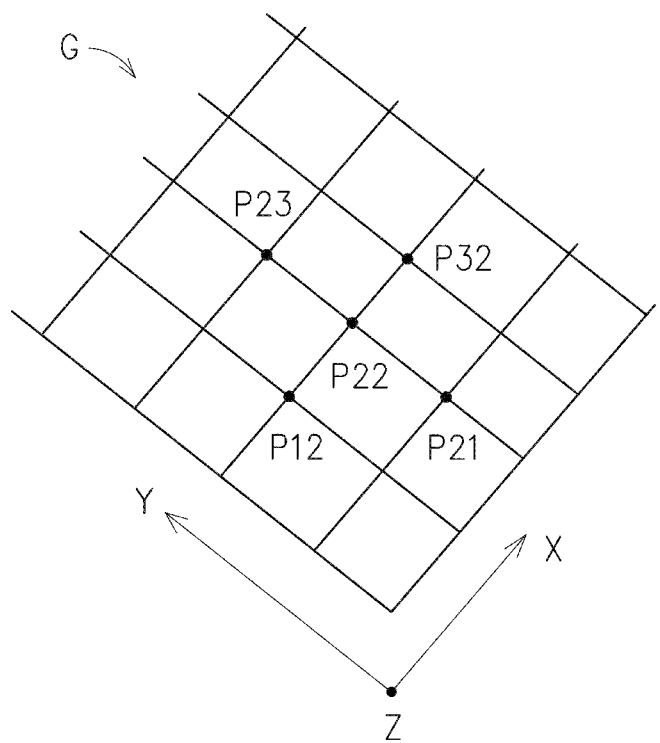
FIG. 6A shows schematically a search in the 2D grid of FIG. 3A.
Figure 6B:
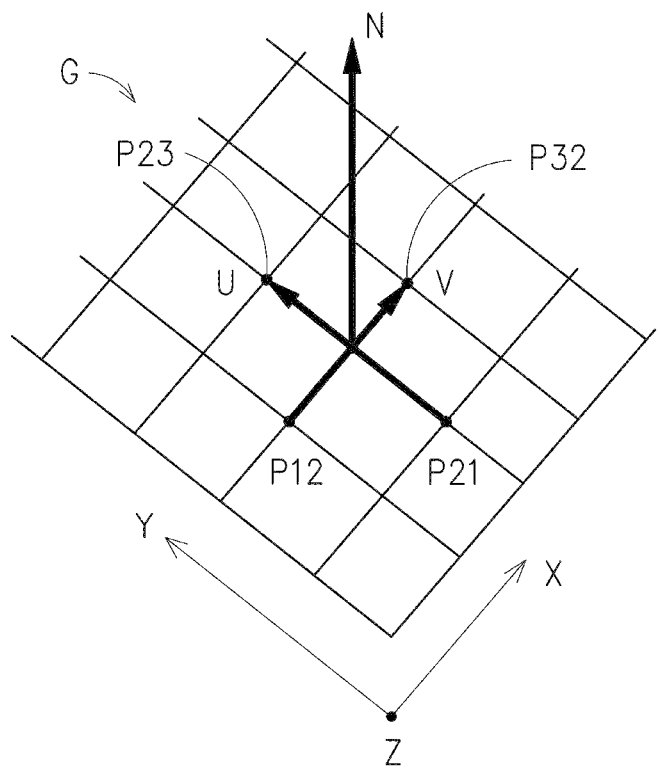
FIG. 6B shows schematically a normal vector of a grid point of FIG. 6A.

In this embodiment, after Step S11 is performed to generate the milling surface by utilizing the numerical control code, then S12 is performed to calculate a normal vector of each grid point on the milling surface. Step S12 can be performed step by step as follows. Firstly, at least two vectors are located for each grid point. Then, these two vectors are crossed to obtain a corresponding normal vector for the respective grid point. Refer now to FIG. 6A and FIG. 6B; where FIG. 6A shows schematically a search in the 2D grid of FIG. 3A, FIG. 6B shows schematically a normal vector of a grid point of FIG. 6A. In calculating the normal vector for the grid point P22, four grid points P12, P21, P32, P23 surrounding the grid point P22 are located. Then, along the Y axis passing the grid point P22, a first normal vector U is formed by connecting the two grid points P21 and P23. On the other hand, along the X axis passing the grid point P22, a second normal vector V is formed by connecting the two grid points P12 and P32, in which the second vector V is not collinear or parallel to the first vector U. Then, a normal vector N can be obtained by applying cross product upon the first normal vector U and the second normal vector V. It shall be explained that, for a concise purpose, FIG. 6A and FIG. 6B raise example in the 2D grid G. However, it shall be understood that, through the aforesaid Step S11, each of the grid points can be in correspondence with an X-axis coordinate, a Y-axis coordinate and a Z-axis coordinate according to the respective position command of the numerical control code. Thereupon, a 3D grid can be formed, and each of the grid points in the 3D grid can locate a normal vector according to the aforesaid vector method. Refer now to FIG. 7A to FIG. 7C; where FIG. 7A demonstrates schematically an embodiment of X-directional components of the normal vectors in accordance with this disclosure, FIG. 7B demonstrates schematically an embodiment of Y-directional components of the normal vectors in accordance with this disclosure, and FIG. 7C demonstrates schematically an embodiment of Z-directional components of the normal vectors in accordance with this disclosure. By having Grid number (5,5) as an example (highlighted by a square in the figure), according to Step S12, the X-directional component of the normal vector is 0, the Y-directional component of the normal vector is close to 0, and the Z-directional component of the normal vector is 1.

In this embodiment, after Step S12 is applied to calculate the normal vector for each of the grid points on the milling surface, then Step S13 is performed to feed back a position feedback of each grid point by a controller of a machine tool, and to derive a corresponding three-axis dynamic position error of the milling surface according to the position command and the position feedback. In this embodiment, the controller of the machine tool is connected with an optical rule or a linear scale, as a linear encoder, for measuring displacements of the cutting tool through photo sensing. The measured displacement is then transmitted to the controller of the machine tool for being monitored, analyzed and displayed. With the aforesaid optical rule, the numerical control code can be loaded into the controller of the machine tool, so that, during the machining process, the optical rule in the controller of the machine tool can feed back a position feedback of each grid point. It shall be explained that the position feedback is the 3D coordinate data of the real position of the machine tool fed back by the optical rule in the controller of the machine tool; i.e., the X-axis coordinate, the Y-axis coordinate and the Z-axis coordinate. Then, based on the position command and the corresponding position feedback, a three-axis dynamic position error of the milling surface can be obtained. In other words, through the optical rule to feed back the real 3D coordinate data of the machine tool, error values of the output position with 3D coordinate data of the position command of the numerical control code loaded into the controller of the machine tool can be obtained; i.e., the three-axis dynamic position errors with respect to the X-axis coordinate, the Y-axis coordinate and the Z-axis coordinate. Referring now to FIG. 8, an embodiment of the position feedbacks and the corresponding three-axis dynamic position errors in accordance with this disclosure is schematically shown. As shown in FIG. 8, for each single time, the optical rule in the controller of the machine tool can feed back a position feedback PB of each grid point. Then, the controller of the machine tool can evaluate the position command and the corresponding position feedback to realize a three-axis dynamic position error EB of the milling surface. In FIG. 8, ERR X stands for the dynamic error value of the X-axis coordinate, ERR Y stands for the dynamic error value of the Y-axis coordinate, and ERR Z stands for the dynamic error value of the Z-axis coordinate.

Figure 9:
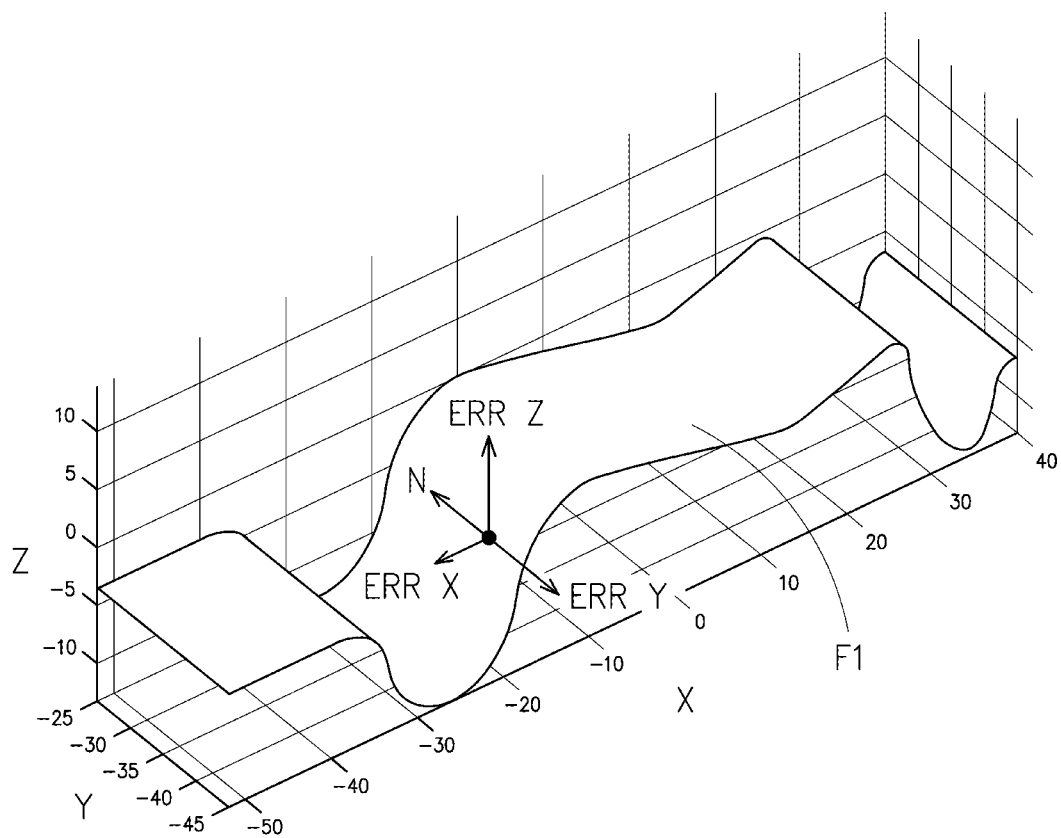
FIG. 9 shows schematically three-axis dynamic position errors for components of a normal vector at the milling surface of FIG. 5.

In this embodiment, after Step S13 is performed to obtain the three-axis dynamic position errors on the milling surface, then Step S14 is performed to calculate a component of the normal vector for the three-axis dynamic position error so as to obtain a normal-vector error value of the grid point. Referring now to FIG. 9, three-axis dynamic position errors for components of a normal vector at the milling surface of FIG. 5 are schematically shown. In Step S13, the three-axis dynamic position errors of the milling surface include the dynamic error value ERR X of the X-axis coordinate, the dynamic error value ERR Y of the Y-axis coordinate, and the dynamic error value ERR Z of the Z-axis coordinate. On the milling surface F1 of Step S12, error values of the normal vector at a grid point of machining path on the milling surface F1 can be obtained by product of the corresponding normal vector N and the three-axis dynamic position errors (i.e., the dynamic error value ERR X of the X-axis coordinate, the dynamic error value ERR Y of the Y-axis coordinate, and the dynamic error value ERR Z of the Z-axis coordinate). These error values are the undercuts in three axial directions. In other words, since the defects on the milling surface of the workpiece and the error values of the normal vector perpendicular to the milling surface are highly related. Empirically, the larger the error value is, the more serious the undercut at the milling surface would be. In this embodiment, the error management of projecting the three-axis dynamic position error to the normal vector on the milling surface can be used to simulate the undercutting, thereby the error caused by the structuring of the machine tool can be noticed, and the error values on the milling surface can be easily observed.

In one embodiment, since the data points of the three-axis dynamic position error output by the controller of the machine tool are generally distributed much denser than the grid points of the milling surface. In other words, the controller of the machine tool can read and output more data points of the three-axis dynamic position errors than the data points displayed by the grid points of the milling surface. Thus, in the aforesaid step of applying dot product to produce the three-axis dynamic position errors (i.e., the dynamic error value ERR X of the X-axis coordinate, the dynamic error value ERR Y of the Y-axis coordinate, and the dynamic error value ERR Z of the Z-axis coordinate) and the normal vector N of every grid point on the milling surface F1, a further step is included. This step is to locate the maximal normal-vector error value among the three-axis dynamic position errors of the grid points within a sampling section, so that loss of data points of the three-axis dynamic position errors can be substantially reduced. Also, the normal-vector error value that can best represent the grid point within a sampling section (i.e., the undercut) can be obtained.

Figures 10, 11:
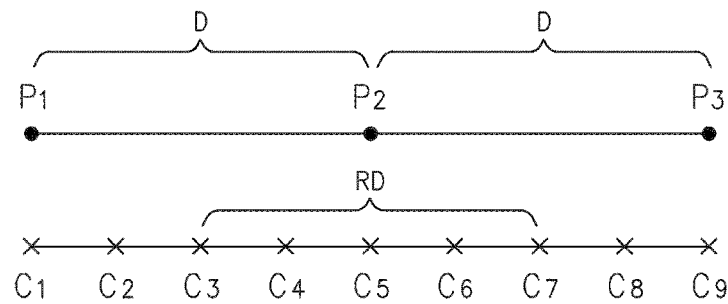
FIG. 10 shows schematically an embodiment of sampling the three-axis dynamic position errors from grid points in accordance with this disclosure.
FIG. 11 demonstrates schematically an embodiment of errors of normal vectors of grid points in accordance with this disclosure.

Referring now to FIG. 10, an embodiment of sampling the three-axis dynamic position errors from grid points in accordance with this disclosure is schematically shown. In the upper portion of FIG. 10, 3 grid points on the milling surface are schematically shown; i.e., a first grid point P1, a second grid point P2 and a third grid point P3. The graph unit D is there to separate the first grid point P1 from the second grid point P2, and also to separate the second grid point P2 from the third grid point P3. In the lower portion of FIG. 10, 9 data points of the three-axis dynamic position errors outputted from the controller of the machine tool are aligned; i.e., the data points C1-C9. From FIG. 10, the first grid point P1 can be respective to data point C1 of the three-axis dynamic position errors, the second grid point P2 can be respective to data point C5 of the three-axis dynamic position errors, and the third grid point P3 can be respective to data point C9 of the three-axis dynamic position errors. Data points C2-C4 are located between the first grid point P1 and the second grid point P2, while data points C6-C8 are located between the second grid point P2 and the third grid point P3. By having the second grid point P2 as an example, also by having the second grid point P2 as a center, and by having ½ graph unit D as the sampling range, then the sampling section would be the RD as shown in FIG. 10. The sampling section RD includes data point C3, data point C4, data point C5, data point C6 and data point C7 of the three-axis dynamic position errors. Then, data point C3, data point C4, data point C5, data point C6 sand data point C7 of the three-axis dynamic position errors are individually produced with the normal vector of the second grid point P2. Then, the maximum of these dot products is picked to represent the normal-vector error value of the second grid point P2. Referring now to FIG. 11, an embodiment of errors of normal vectors of grid points in accordance with this disclosure is schematically shown. By having Grid number (5, 5) as an example, the normal-vector error value is 2.2204e−15.

Figure 12A:
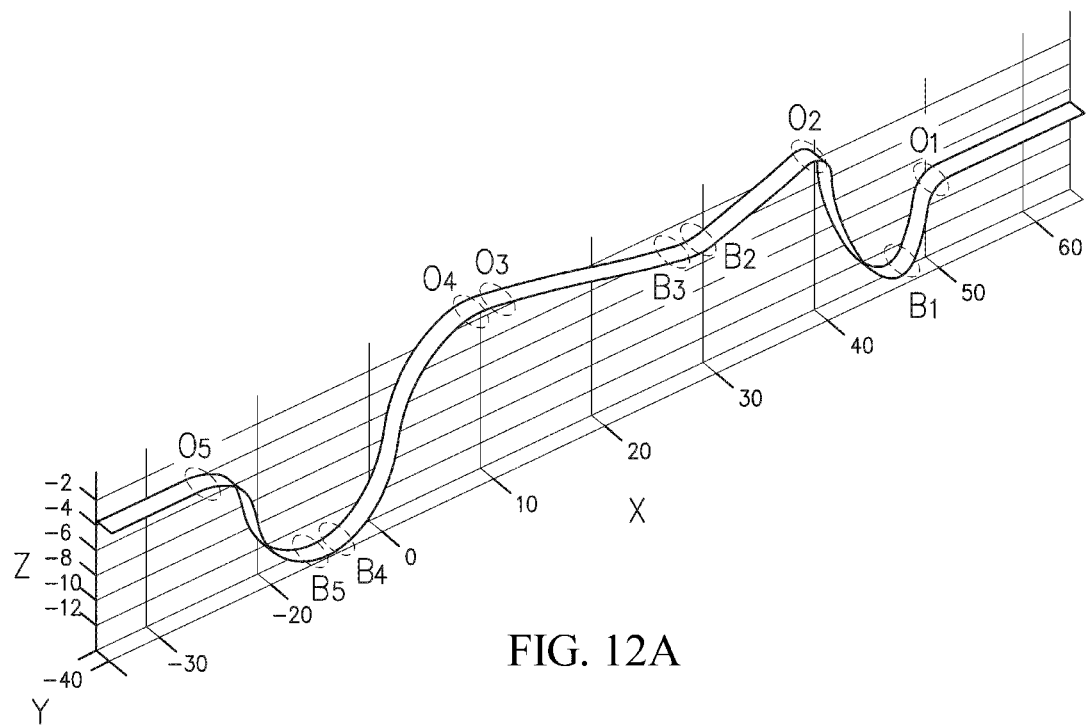
FIG. 12A shows schematically normal-vector errors in an embodiment of the milling surface in accordance with this disclosure.
Figure 12B:
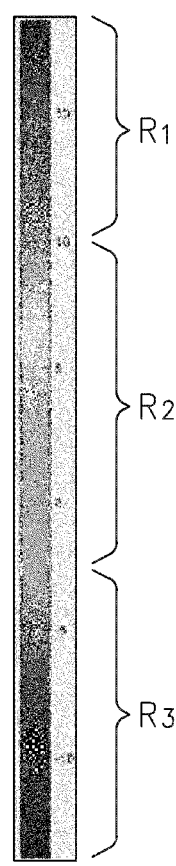
FIG. 12B shows schematically corresponding numerical values of the normal-vector errors of FIG. 12A.

In this embodiment, after Step S14 is performed to obtain the normal-vector error value for each grid point on the milling surface, then Step S15 is performed to display undercutting information of the normal-vector error value of the corresponding grid point on the milling surface. Refer now to FIG. 12A and FIG. 12B; where FIG. 12A shows schematically normal-vector errors in an embodiment of the milling surface in accordance with this disclosure, and FIG. 12B shows schematically corresponding numerical values of the normal-vector errors of FIG. 12A. It shall be explained that, for a concise purpose, a portion of the milling surface in the Y-axial direction of FIG. 12A is adopted for further explanation. In this embodiment, the normal-vector error values of the individual grid points on the milling surface from Step S14 are sorted according to the sections of the normal-vector error value shown in FIG. 12B. For example, the normal-vector error value within the first section R1 is larger than that within the second section R2, and that within the third section R3. In addition, the normal-vector error value within the second section R2 is larger than that within the third section R3. In FIG. 12A, different colors or densities can be assigned to respective sections in FIG. 12B, and also on the milling surface of FIG. 12A. For example, the normal-vector error values for the milling sections B1-B5 on the milling surface of FIG. 12A are respective to the normal-vector error values in the first section R1 of FIG. 12B, with the values larger than 10. Namely, each of the normal-vector error values for the milling sections B1-B5 is larger than 10. A positive error value stands for a swallow cutting, i.e., might be an insufficient cutting. On the other hand, the normal-vector error values for the milling sections Q1-Q5 on the milling surface of FIG. 12A are respective to the normal-vector error values in the third section R3 of FIG. 12B, with the values less than −10. Namely, each of the normal-vector error values for the milling sections Q1-Q5 is less than −10. A negative error value stands for a deep cutting, i.e., might be an excessive cutting (undercut). In other words, by providing this embodiment, the undercut information can be displayed on the milling surface, possible cutting defects along the machining path can be alerted prior to a real cutting, and the cutting prints can be easily observed along the machining path.

Figure 13:
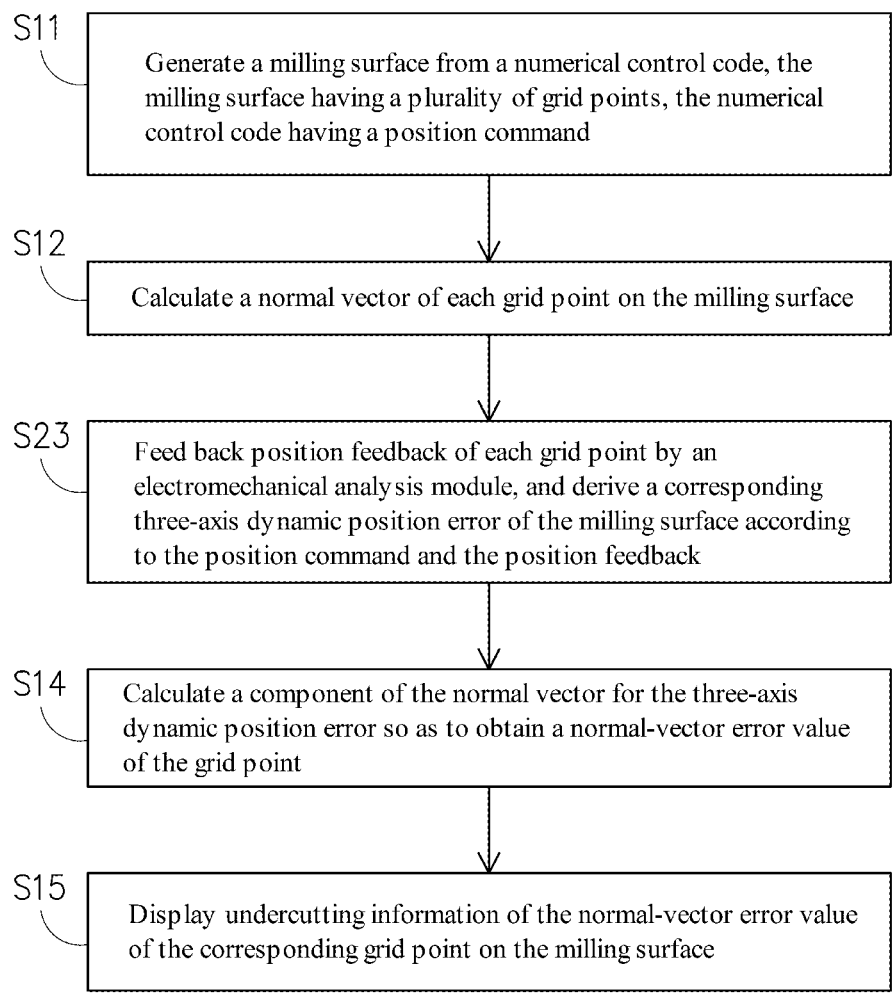
FIG. 13 is a flowchart of another embodiment of the simulation method for milling by use of a dynamic position error in accordance with this disclosure.

Referring now to FIG. 13, a flowchart of another embodiment of the simulation method for milling by use of a dynamic position error in accordance with this disclosure is schematically shown. It shall be explained that the simulation method for milling by use of a dynamic position error S20 of FIG. 13 and the simulation method for milling by use of a dynamic position error S10 of FIG. 1 are largely the same in most of the steps. The steps having the same numbers are basically the same for the two embodiments S10, S20, and thus details for those steps would be omitted herein. On the other hand, the difference between the two embodiments S10, S20 is that the embodiment S20 has a step S23 to replace the step S13 of the embodiment S10 of FIG. 1. In embodiment S20, after Step 12 is performed to calculate a normal vector of each grid point on the milling surface, then Step S23 is performed to feed back a position feedback of each grid point by an electromechanical analysis module, and to derive a corresponding three-axis dynamic position error of the milling surface according to the position command and the position feedback.

In this embodiment, the controller of the machine tool is connected with an electromechanical analysis module. The electromechanical analysis module can establish a kinematic equations for characterizing motions of the platform, the motor, the screw bar, the bearing and related components on the machine tool. This kinematic equation is realized to further establish a machine tool servo control model including generally a current loop, a speed loop and a position loop in an overlapping manner. The position loop includes the current loop and the speed loop, and the speed loop includes the current loop. With the inclusion of the electromechanical analysis module, the electromechanical analysis module can receive the position commands in the numerical control code loaded from the controller of the machine tool and a machine-tool error, in which the machine-tool error can be position an error of cutting tip or a deformation of screw bar. The position error of cutting tip can be obtained experimentally by a frequency response function (FRF). The electromechanical analysis module in the controller of the machine tool uses the machine tool servo control model to feed back a position feedback of each grid point. It shall be explained that the term "position feedback" herein is the 3D coordinate data of the real position of the machine tool fed back by the electromechanical analysis module in the controller of the machine tool. The electromechanical analysis module receives the position commands and the machine-tool errors. According to the looping model for the machine tool servo control model including the current loop, the speed loop and the position loop, the position feedback can be obtained by simulations. Then, according to the individual position commands and the respective position feedbacks, a three-axis dynamic position error of each grid point on the milling surface can be obtained.

In summary, by providing the simulation method for milling by use of a dynamic position error in this disclosure, since the defects on the milling surface of the workpiece and the error values of the normal vector perpendicular to the milling surface are highly related. Empirically, the larger the error value is, the more serious the undercut at the milling surface would be. In this embodiment, the error management by projecting the three-axis dynamic position error to the normal vector on the milling surface can be used to simulate the undercutting. Such a method can provide precision estimates at errors, machining outcome and positions, thus the error caused by the structuring of the machine tool can be easily noticed, the error values on the milling surface can be clearly observed, possible cutting defects along the machining path can be alerted prior to a real cutting, and the cutting prints can be easily observed along the machining path.

Further, the simulation method for milling by use of a dynamic position error provided by this disclosure can reduce the complicated computation upon the material removal by crossing spatially the cutting tool and the workpiece. Also, by applying dot product to produce the three-axis dynamic position errors with the corresponding normal vector on the milling surface, the normal-vector error values can be obtained with an enhanced simulation speed.

In addition, the method provided by this disclosure can locate the maximum error values in the same machining method, and thus further improvement upon the machining method can be easily carried out.

In addition, this disclosure can further evaluate different machining error values among various machining methods to determine a preferable machining path, or to judge the effects from different machining variables, such that the object of determining a better machining method for specific products can be achieved.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A simulation method for milling by use of a dynamic position error, applicable to connect a controller of a machine tool, the simulation method comprising the steps of:
    (a) generating a milling surface from a numerical control code, the milling surface having a plurality of grid points, the numerical control code having a position command;
    (b) calculating a normal vector for each of the plurality of grid points on the milling surface;
    (c) feeding back a position feedback of each of the plurality of grid points by the controller of the machine tool, and deriving a corresponding three-axis dynamic position error of the milling surface according to the position command and the position feedback;

(d) calculating a component of the normal vector for the three-axis dynamic position error so as to obtain a normal-vector error value of the corresponding grid point; and (e) displaying undercutting information of the normal-vector error value of the corresponding grid point on the milling surface;

wherein the step (d) includes a step of applying dot product to produce the three-axis dynamic position error and the normal vector of the corresponding grid point on the milling surface.

2. The simulation method for milling by use of a dynamic position error of claim 1, wherein the step (a) includes the steps of:
(a1) forming a 2D grid with a range of X coordinates and another range of Y coordinates by utilizing the position command of the numerical control code; and
(a2) according to an X coordinate and a Y coordinate of the position command of the numerical control code to obtain a corresponding Z coordinate of the position command by performing interpolation based on the 2D grid to form the milling surface.

3. The simulation method for milling by use of a dynamic position error of claim 1, wherein the step (b) includes the steps of:
(b1) locating at least two vectors for each of the plurality of grid points, the at least two vector passing the corresponding grid point; and
(b2) applying cross product to produce the at least two vectors to obtain the normal vector for the corresponding grid point.

4. The simulation method for milling by use of a dynamic position error of claim 1, further including a step of locating a maximum of the normal-vector error values from the three-axis dynamic position errors within a sampling section around the corresponding grid point.

5. A simulation method for milling by use of a dynamic position error, applicable to connect a machine tool, the machine tool further connecting an electromechanical analysis module, the simulation method comprising the steps of:
(a) generating a milling surface from a numerical control code, the milling surface having a plurality of grid points, the numerical control code having a position command;
(b) calculating a normal vector for each of the plurality of grid points on the milling surface;
(c) feeding back a position feedback of each of the plurality of grid points by the electromechanical analysis module, and deriving a corresponding three-axis dynamic position error of the milling surface according to the position command and the position feedback;

(d) calculating a component of the normal vector for the three-axis dynamic position error so as to obtain a normal-vector error value of the corresponding grid point; and (e) displaying undercutting information of the normal-vector error value of the corresponding grid point on the milling surface;

wherein the step (d) includes a step of applying dot product to produce the three-axis dynamic position error and the normal vector of the corresponding grid point on the milling surface.

6. The simulation method for milling by use of a dynamic position error of claim 5, wherein the step (a) includes the steps of:
(a1) forming a 2D grid with a range of X coordinates and another range of Y coordinates by utilizing the position command of the numerical control code; and
(a2) according to an X coordinate and a Y coordinate of the position command of the numerical control code to obtain a corresponding Z coordinate of the position command by performing interpolation based on the 2D grid to form the milling surface.

7. The simulation method for milling by use of a dynamic position error of claim 5, wherein the step (b) includes the steps of:
(b1) locating at least two vectors for each of the plurality of grid points, the at least two vector passing the corresponding grid point; and
(b2) applying cross product to produce the at least two vectors to obtain the normal vector for the corresponding grid point.

8. The simulation method for milling by use of a dynamic position error of claim 5, further including a step of locating a maximum of the normal-vector error values from the three-axis dynamic position errors within a sampling section around the corresponding grid point.

9. The simulation method for milling by use of a dynamic position error of claim 5, wherein the step (c) includes the steps of:
(c1) establishing a machine tool servo control model including a current loop, a speed loop and a position loop; and
(c2) the electromechanical analysis module according to the position command of the numerical control code and a machine-tool error to obtain the position feedback of each of the plurality of grid points, the machine-tool error including a position error of a cutting tip or a deformation of a screw bar.

* * * * *